United States Patent
Sinangil et al.

(10) Patent No.: US 9,208,900 B2
(45) Date of Patent: Dec. 8, 2015

(54) SYSTEM AND METHOD FOR PERFORMING ADDRESS-BASED SRAM ACCESS ASSISTS

(71) Applicant: NVIDIA Corporation, Santa Clara, CA (US)

(72) Inventors: Mahmut Ersin Sinangil, Medford, MA (US); William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/147,411

(22) Filed: Jan. 3, 2014

(65) Prior Publication Data

US 2014/0204687 A1    Jul. 24, 2014

Related U.S. Application Data

(63) Continuation-in-part of application No. 13/748,499, filed on Jan. 23, 2013.

(51) Int. Cl.
| | |
|---|---|
| *G11C 29/00* | (2006.01) |
| *G11C 29/52* | (2006.01) |
| *G11C 7/12* | (2006.01) |
| *G11C 8/08* | (2006.01) |
| *G11C 11/417* | (2006.01) |
| *G11C 11/418* | (2006.01) |
| *G11C 11/419* | (2006.01) |
| G11C 29/44 | (2006.01) |

(52) U.S. Cl.
CPC *G11C 29/52* (2013.01); *G11C 7/12* (2013.01); *G11C 8/08* (2013.01); *G11C 11/417* (2013.01); *G11C 11/418* (2013.01); *G11C 11/419* (2013.01); *G11C 2029/4402* (2013.01)

(58) Field of Classification Search
CPC ........ G11C 11/413; G11C 8/08; G11C 5/145; G11C 7/12; G11C 11/418; G11C 11/419; G11C 11/4074
See application file for complete search history.

(56) References Cited

U.S. PATENT DOCUMENTS

| | | | | | |
|---|---|---|---|---|---|
| 6,160,745 | A | * | 12/2000 | Hashimoto | ............... 365/200 |
| 2010/0207924 | A1 | * | 8/2010 | Saito | ............... 345/211 |
| 2011/0063932 | A1 | * | 3/2011 | Chandra et al. | ............... 365/194 |
| 2012/0106237 | A1 | | 5/2012 | Dengler et al. | |
| 2012/0140551 | A1 | | 6/2012 | Arsovski et al. | |

OTHER PUBLICATIONS

Karl et al., "A 4.6ghz 162Mb SRAM Design in 22nm Tri-Gate CMOS Technology with Integrated Active VMIN-Enhancing Assist Circuitry," 2012 IEEE Solid-State Circuits Conference, ISSCC 2012, Session 13, High-Performance Embedded SRAM, 13.1, pp. 230-231 and continuation page.

Yabuuchi et al., "A 45nm 0.6V Cross-Point 8T SRAM with Negative Biased Read/Write Assist," 2009 Symposium on VLSI Circuits Digest of Technical Papers, 2009, pp. 158-159.

Non-Final Office Action from U.S. Appl. No. 13/748,499, dated Mar. 16, 2015.

(Continued)

*Primary Examiner* — Son Dinh
*Assistant Examiner* — Uyen B Tran

(57) ABSTRACT

A method and a system are provided for performing address-based memory access assist. An address is received for a memory access and a determination is made, based on the address, that access assist is enabled for at least one storage cell corresponding to the address. The access assist is applied to the at least one storage cell to perform the memory access.

20 Claims, 11 Drawing Sheets

(56) References Cited

OTHER PUBLICATIONS

Office Action from Taiwan Patent Application No. 102141085, dated May 18, 2015.

Final Office Action from U.S. Appl. No. 13/748,499, dated Aug. 17, 2015.

Office Action from Taiwan Patent Application No. 103101970, dated Aug. 4, 2015.

* cited by examiner

SYSTEM AND METHOD FOR PERFORMING ADDRESS-BASED SRAM ACCESS ASSISTS

CLAIM OF PRIORITY

This application is a continuation-in-part of U.S. patent application Ser. No. 13/748,499, filed Jan. 23, 2013, the entire contents of which is incorporated herein by reference.

This invention was made with Government support under LLNS subcontract B599861 awarded by DOE, and with Government support under Agreement HR0011-13-3-0001 awarded by DARPA. The Government has certain rights in this invention.

FIELD OF THE INVENTION

The present invention relates to storage circuits, and, more specifically to access assist.

BACKGROUND

Static random access memory (SRAM) arrays are sometimes designed to include voltage assist circuitry to improve performance. Specifically, voltage assist can improve the ability to read from and write to SRAM cells, and can prevent stored values from being inadvertently flipped during read and write operations. Existing assist mechanisms are typically designed for worst case scenarios, to account for a wide range of operating conditions and fabrication variations. This can result in the assist circuitry being relatively large and consuming a significant amount of power.

Thus, there is a need for addressing the issue of access reliability and/or other issues associated with the prior art.

SUMMARY

A system and method are provided for performing address-based memory access assist. An address is received for a memory access and a determination is made, based on the address, that access assist is enabled for at least one storage cell corresponding to the address. The access assist is applied to the at least one storage cell to perform the memory access.

DETAILED DESCRIPTION

As technology has progressed, SRAM devices have become smaller and operating voltages have decreased, providing power savings and improvements in performance. However, as these parameters are reduced, the variability intrinsic in fabrication tolerances and operating conditions have a greater potential to negatively affect performance of the devices. In particular, these improvements allow storage of memory states with lower levels of charge. This, however, can increase the likelihood that the device will be affected adversely by noise sources (e.g., ambient electromagnetic noise, noise radiated by other system components, power supply noise, etc.), by leakage current(s), etc. Specific design challenges include ensuring the ability to reliably read from and write to cells, and to avoid inadvertent corruption of memory states during read and write operations.

Voltage assist can be used to address these challenges and ensure successful operation in the face of decreasing voltages and physical dimensions. For example, various signals, nodes, etc. can be boosted beyond a range bounded by the positive and negative supplies used to otherwise operate the memory storage cells. As used herein, the term "voltage boost" and the like will be used to refer to any voltage outside the voltage supply range of a memory cell, and may therefore denote, for example, increasing a signal/node to a level above a positive supply or to a level below a negative supply.

One prior assist method is to continuously provide a single boosted voltage level to all of the wordlines and bitlines of the SRAM array, for example with a charge pump or other auxiliary supply. The boosted voltage level is selected at design time to account for variations in performance and behavior from cell to cell, for example as a result of device variations occurring during fabrication. The level also must take into account all of the potential operating conditions and modes. This necessarily entails increased energy use, and that assist will at times be applied when it is not needed, or at a level beyond or different than that needed for a particular wordline, bitline or cell. Furthermore, charge pumps and the like can be relatively large in size (e.g., due to one or more large capacitors), which can negatively impact size, cost, weight, etc., of the device.

The present discussion provides for novel and improved methods for providing voltage boost. In one embodiment, voltage boost is selectively produced and applied dynamically at a level based on the particular memory cell(s) being accessed, i.e., based on the address of the cell. In addition to address-based voltage boost, boost can be generated by capacitively coupling charge onto wordlines and bitlines, thus eliminating the need for an auxiliary supply and its associated disadvantages.

Figure 1A:
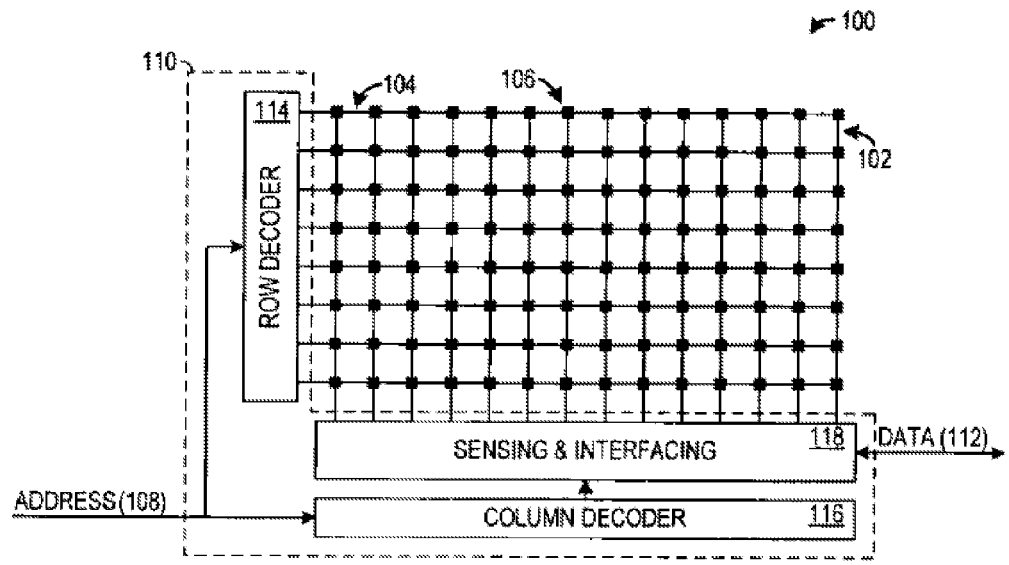
FIG. 1A schematically shows an example SRAM array that may be provided with embodiments of voltage boost mechanisms described herein.

Before discussing the specific boost mechanisms, an exemplary SRAM array and cell with which they may be used will be described with reference to FIGS. 1A and 1B. FIG. 1A schematically depicts an example of an SRAM array 100 that can be implemented with the boost systems and methods described herein. Array 100 includes bitlines 102 and wordlines 104, referred to generically as SRAM lines, used to access SRAM cells 106. Each cell 106 is defined at the intersection between one or more bitlines 102 and one or more wordlines 104. In typical configurations, each SRAM cell 106 is defined at the intersection of a single wordline 104 and a pair of bitlines 102, with each row of SRAM cells 106 coupled to a common wordline 104 and each column of SRAM cells 106 coupled to a common pair of bitlines 102, though other configurations are possible.

In order to interact with the memory, a cooperating unit (e.g., CPU, GPU, etc.), provides an address 108 for one or more particular SRAM cells 106, which is received and used by peripheral circuitry 110 to either read or write data 112 to the addressed SRAM cell(s). Circuitry 110 may include, for example, row decoder 114 and column decoder 116 configured to receive address 108 and thereby initiate operations to access the SRAM cell(s) identified by the address. Once the desired cell(s) have been selected, data 112 is either retrieved (read) from the addressed SRAM cell via sensing and interfacing logic 118 or provided (written) to the addressed SRAM cell via logic 118. It will be appreciated that the components illustrated in FIG. 1A are provided for the ease of understanding, and typical memory devices may include additional and/or different components in some implementations.

Figure 1B:
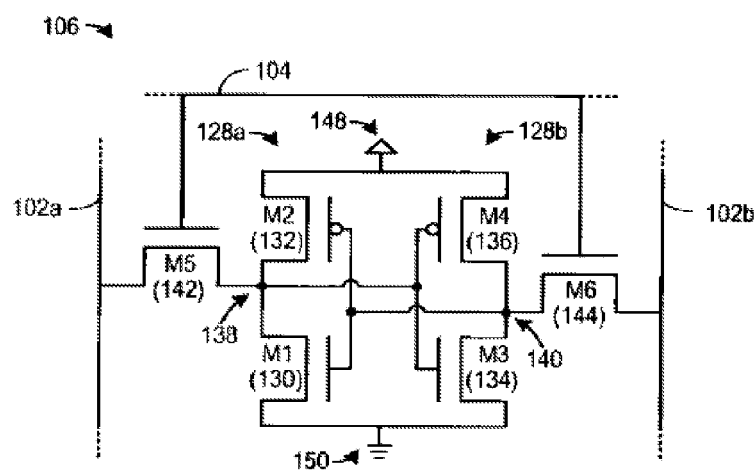
FIG. 1B schematically shows an SRAM cell of the SRAM array of FIG. 1A, in accordance with one embodiment.

Turning now to FIG. 1B, a single SRAM cell 106 of FIG. 1A is schematically shown at the transistor level. Specifically, SRAM cell 106 is illustrated as a six transistor "6T" cell, though the present discussion of voltage boosting is applicable to other SRAM configurations. For example it can be applied to an eight transistor "8T" cell. SRAM cell 106 includes a pair of cross-coupled inverters 128 for storing a single memory bit. First inverter 128a includes transistors 130 and 132; second inverter 128b includes transistors 134 and 136. The inverters cooperate to store complimentary states at storage nodes 138 and 140, with each inverter 128 reinforcing operation of the other via positive feedback. For example, if SRAM cell 106 were storing logic 1, node 138 is held at logic 1 with node 140 at logic 0.

A read of a cell 106 may proceed as follows. First, bitlines 102a and 102b are "precharged" to the positive supply voltage 148 (e.g., $V_{DD}$). Wordline 104 is then asserted to enable access transistors 142 and 144, which respectively couples nodes 138 and 140 to bitlines 102a and 102b. Assuming node 140 is held at the negative supply (logic 0) by inverter 128b (i.e., via conduction of transistor 134) and the bitlines are no longer being actively driven, bitline 102b is discharged through transistors 134 and 144. As bitline 102b is discharged, a differential voltage is observed between bitlines 102a and 102b, since bitline 102a may remain substantially near the supply voltage due to the intrinsic capacitance of bitline 102a. This voltage differential is detectable, for example, via a differential sense amplifier coupled to the pair of bitlines 102a and 102b, and data 112 in the form of a binary digital value is provided based on the voltage differential (e.g., via sensing and interfacing logic 116).

A write of SRAM cell 106 may proceed as follows. First, one of the bitlines (e.g., bitline 102a) is driven to a desired value to be stored via driving circuitry (e.g., via circuitry 110), and bitline 102b is driven with the complimentary value. For the purpose of this example, the desired value is a logic 1, corresponding to positive supply voltage 148, and bitline 102a is therefore driven to the positive supply voltage while bitline 102b is driven to negative supply voltage 150. Once the bitlines are appropriately driven, wordline 104 is asserted in order to couple SRAM cell 106 to bitlines 102. Once the access transistor is coupled, the side pulling down overpowers its inverter, thereby writing the desired value into the SRAM cell.

From the above, it will be appreciated that reliable read operation can depend upon the ability of the SRAM cell (e.g., via NMOS transistors 130 and/or 134) to drive one of the precharged bitlines toward negative supply voltage 150 (e.g., ground). Similarly, the ability to reliably write information to the SRAM cell may rely upon the ability of one of the bitlines (e.g., via driving circuitry thereof) to pull one of nodes 138 and 140 to the negative supply voltage by overpowering one of PMOS transistors 132 and 136, depending upon the state to be written. In typical scenarios, access transistors 142 and 144 are sized smaller than NMOS transistors 130 and 134, so as to ensure that the access transistors do not overpower the NMOS transistors during a read operation and corrupt the stored information. Similarly, the access transistors may be sized larger than PMOS transistors 132 and 136 so as to ensure that the PMOS transistors, and thus the cross-coupled inverters, are able to be overpowered during a write operation.

However, as mentioned above, variations in fabrication and/or in operating conditions (e.g., temperature), may result in significant variation in the performance of individual transistors. Accordingly, SRAM cell 106 may be sized according a worst-case scenario, for example, by increasing the relative sizing of the various transistors. Such a configuration may provide the desired read/write reliability at the expense of size and/or performance (e.g., due to increased time to vary charge at the various nodes).

It may therefore be desirable to selectively provide voltage assist to SRAM cell(s) 106 of memory device 100 on an as-needed basis, thereby potentially enabling smaller cell sizing and/or decreased power consumption without sacrificing read/write reliability. As illustrated, a typical SRAM cell is supplied with five "signals," namely two bitline signals 102, one wordline signal 144, a positive supply 148, and a negative supply 150 (e.g., ground). Accordingly, adjustment of any one or more of these signals may aid performance.

Figure 2A:
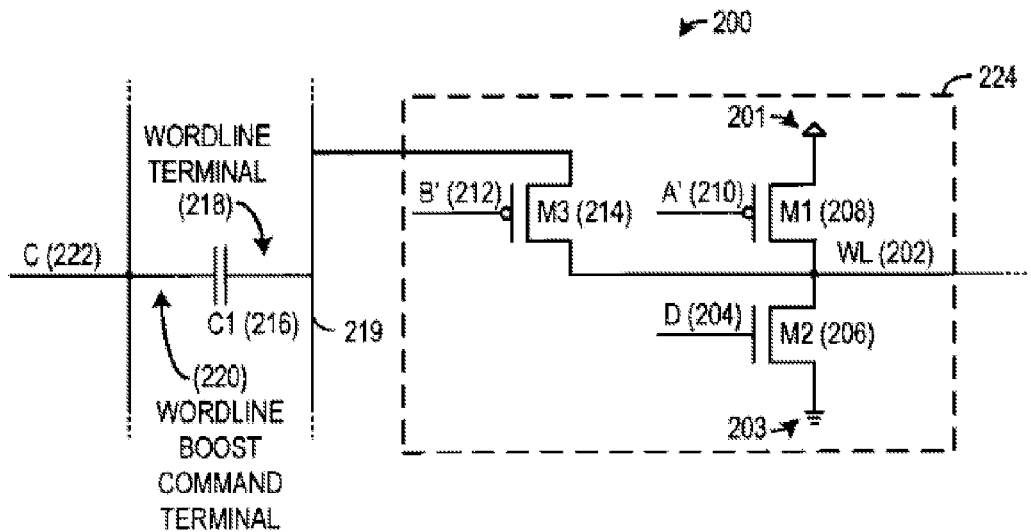
FIG. 2A schematically shows an example of voltage boost circuitry for providing a boosted voltage on SRAM wordlines, in accordance with one embodiment.

With this in mind, FIG. 2A schematically shows voltage boost circuitry 200 for providing a boosted voltage on one or more wordlines 202 (e.g., wordline 104) according to an embodiment of the present disclosure. As described above with reference to typical SRAM cell 106, the ability to write data to an SRAM cell may rely upon the ability to overpower one of the PMOS transistors (e.g., transistors 132 and 136) of a cross-coupled inverter pair. Past approaches have therefore included sizing the access transistors (e.g., access transistors 142 and 144) larger than the PMOS transistors in order to ensure that each access transistor is able to overpower the appropriate PMOS transistor (i.e., by conducting a larger amount of current). Past approaches have also included boosting wordlines by connecting to a fixed higher-voltage supply.

In addition to or instead of a sizing approach, a boosted voltage can be applied to the access transistors. The current conducted by a NMOS FET transistor (e.g., access transistors 142 and 144) increases with the voltage differential between the gate terminal (e.g., via wordline 104 or 202) and the source terminal (e.g., via bitline(s) 102). The illustrated voltage boost circuitry 200 of FIG. 2A is configured to increase a voltage level of the signal applied to wordline 202 above the level of the positive supply to improve performance of the SRAM cells being accessed.

Figure 2B:
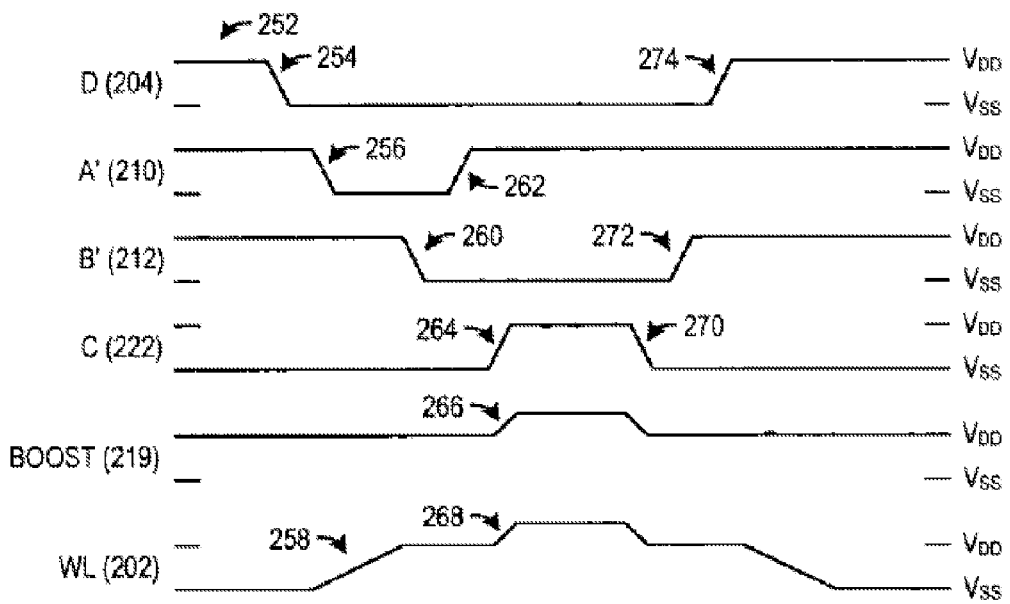
FIG. 2B shows example waveforms occurring during operation of the voltage boost circuitry of FIG. 2A, in accordance with one embodiment.

Referring to FIG. 2A and the associated waveforms of FIG. 2B, an example boost operation will now be described. When a particular wordline 202 is not being accessed, the wordline is deasserted (e.g., by driving the wordline to the negative supply voltage) in order to disable the coupled access transistors (e.g., access transistors 142 and 144). As illustrated at 252 of FIG. 2B, active-high signal D (204) applied to transistor 206 is asserted, which enables transistor 206 and pulls/holds wordline 202 to the negative supply 203. Next, as illustrated at 254, signal D is deasserted to disconnect wordline 202 from the negative supply.

Active-low signal A' (210) is then, at 256, applied to transistor 208 to enable PMOS transistor 208. As illustrated at 258 of FIG. 2B, the positive supply is connected and the voltage on wordline 202 begins to rise as the current being conducted though transistor 208 charges an intrinsic capacitance of wordline 202. At 260, active-low signal B' (212) is applied to transistor 214, coupling wordline 202 to wordline terminal 218 of wordline boost capacitor 216 at boost node 219. While terminal 218 of capacitor 216 is coupled to the wordline, wordline boost command terminal 220 of capacitor 216 is held at the negative supply voltage by signal C; this restores the charge across capacitor 216 to the full supply potential. Signal C, more generally referred to herein as a "boost command signal," may be distributed, for example, to each wordline driver 224 in some embodiments, whereas the boost command signal may be provided to a subset of wordline drivers 224 or an individual driver in other embodiments.

Active-low signal A' is then deasserted at 262, thus decoupling wordline 202 from both the positive supply and the negative supply. This decoupled, or "floating," state of wordline 202 allows the wordline to be boosted above positive supply voltage 201. At 264, active-high signal C (222) applied to wordline boost command terminal 220 is asserted. As this occurs, charge stored via wordline boost capacitor 216 is shared with the intrinsic capacitance of wordline 202, thereby effecting a rise in voltage on boost node 219 above the positive supply at 266, and thus a rise on the coupled wordline 202 at 268. In other words, voltage boost circuitry 200 operates to boost the voltage seen at wordline 202 above positive supply voltage 201 by coupling wordline boost capacitor 216 to the intrinsic bit line capacitance of wordline 202, Signal C triggers the boost and may therefore be referred to as a "wordline boost command signal" or, more generally, as a "boost command signal."

At this point, one or more SRAM cell(s) coupled to wordline 202 may be written with desired information by appropriately driving the bitline(s), for example, as described above with reference to typical SRAM cell 106. The boosted voltage on wordline 202 may ensure that coupled access transistor(s) (e.g., access transistors 142 and 144) are able to provide suitable current to write the desired information. Once the data is written, signal C is deasserted at 270 in order to discharge the wordline to the positive supply voltage. Next, active-low signal B' is deasserted, thereby disabling transistors 214 and decoupling wordline terminal 218 of boost capacitor 216 from wordline 202. Finally, signal D is asserted at 274, so as to activate transistor 206 and lower wordline 202.

By using the intrinsic capacitance of each wordline 202, the illustrated voltage boost circuitry 200 can use less space than the auxiliary supplies often used to provide voltage assist in prior approaches and that typically employ relatively large components. Although boost capacitor 216 may be large in some embodiments, its output boost node 219 may be distributed to a plurality of wordline drivers 224 that are each coupled to an individual wordline 202. In this way, a single boost, capacitor may be used across multiple rows to provide selective control over independent wordline drivers 224 (e.g., via transistors 214). By selectively and transiently generating a boosted voltage as compared to prior, constant-generation approaches, the described voltage boost circuitry may reduce power losses (e.g. due to reduced conversion, leakage, and/or distribution losses), reduced physical sizing, and/or may otherwise provide improved performance.

Voltage boost circuitry 200 and/or signal(s) may be implemented in or as part of the control logic (e.g., circuitry 110) of a particular memory device. It will be appreciated that the above-described signals are presented for the purpose of example, and that additional configurations (e.g., different activation levels, logic families, etc.) are possible without departing from the scope of the present disclosure. For example, although the waveforms of FIG. 2B are illustrated as generally swinging between negative supply level $V_{SS}$ (e.g., ground) and positive supply level $V_{DD}$, various configurations may include mechanisms for dynamically adjusting the swing of a particular signal. Such mechanisms, for example, may be desirable to ensure proper functioning of voltage boost circuitry 200 during the transient generation of voltage boost.

In particular, voltage translation/level-shifting mechanisms (e.g., single ended and/or differential cascode driver) can be used to dynamically adjust signals to maintain proper operation during boosting. During "normal" (e.g., non-boosted) operation, signals are bounded by the positive supply voltage and the negative supply voltage, but during boosting, they are level-shifted so they are bounded by the boosted voltage and the negative supply voltage. This level shifting ensures desired operation of the voltage boost circuitry across a changing voltage range. Absent level shifting, PMOS transistors 208 and/or 214 could be unintentionally enabled during generation of the boosted voltage if the respective gate-to-source voltage differential (e.g., voltage differential between the boosted voltage and the positive supply voltage) exceeds a threshold voltage of transistors 208 and/or 214, for example. As such considerations may not apply to NMOS transistors, signals provided to NMOS transistors (e.g., signal D at transistor 206) may not be level-shifted, through it will be appreciated that these scenarios are presented for the purpose of example, and are not intended to be limiting in any manner.

In addition to boosting wordlines above the positive supply, performance may be improved by boosting bitlines below a negative supply voltage. In both cases, voltages are adjusted at terminals of the cell access transistors. The ability of the access transistors (e.g., access transistors 142 and 144) to conduct current increases with an increasing gate-to-source voltage differential; thus, increased current conduction is possible by increasing the gate voltage (e.g., increasing wordline voltage) and/or decreasing the source voltage (e.g. decreasing bitline voltage).

Figure 3A:
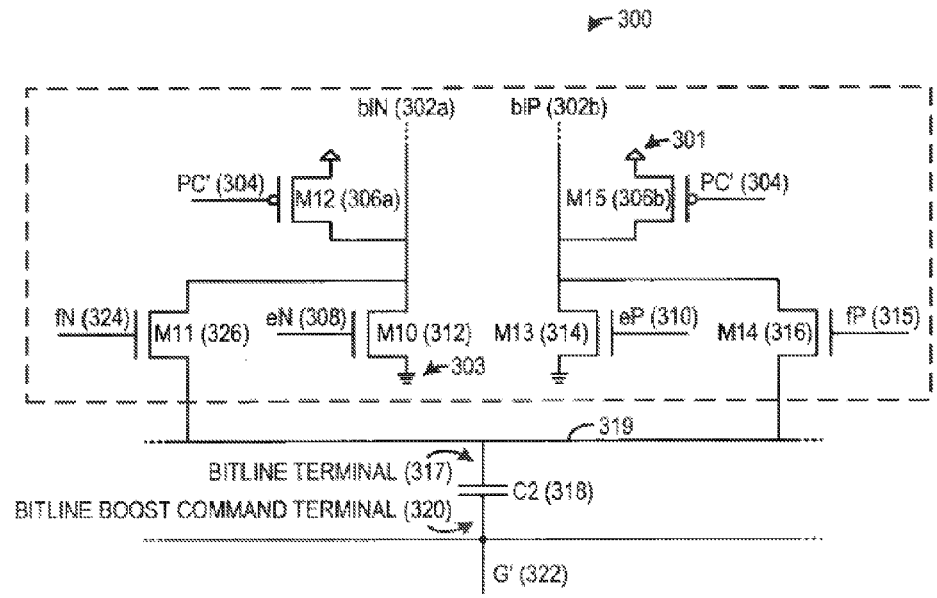
FIG. 3A schematically shows an example of voltage boost circuitry for providing a boosted voltage on SRAM bitlines, in accordance with one embodiment.

Accordingly, turning now to FIG. 3A and the accompanying waveforms of FIG. 3B, voltage boost circuitry 300 can be used to boost bitline voltage by decreasing it to a level below that of the negative supply. As discussed with reference to FIG. 1A, bitlines 302a and 302b are precharged to positive supply voltage 301 before an SRAM cell (e.g., SRAM cell 106) is coupled to the bitlines via one or more access transistors (e.g., access transistors 142 and 144). Thus, as illustrated at 352 in the waveforms of FIG. 3B, active-low signal PC' (304) applied to precharge PMOS transistors 306a and 306b is asserted to enable the transistors and ensure that the bitlines are held to the positive supply voltage. Next, as illustrated at 354, signal PC' is deasserted to disconnect bitlines 302 from the positive supply. As with wordlines 202, it be appreciated that each bitline 302 has an intrinsic capacitance that maintains the bitline near the positive supply voltage for a time upon disabling of precharge transistors 306.

Once the bitlines are decoupled from the positive supply, one of signals eN (308) and eP (310) is asserted in order to enable either transistor 312 or 314, respectively, depending on whether a logic 1 or logic 0 is being written to the addressed SRAM cell. For ease of understanding, description of the voltage boost circuitry will continue with reference to driving bitline 302b towards negative supply 303 by asserting active-high signal eP applied to transistor 314 at 356.

Figure 3B:
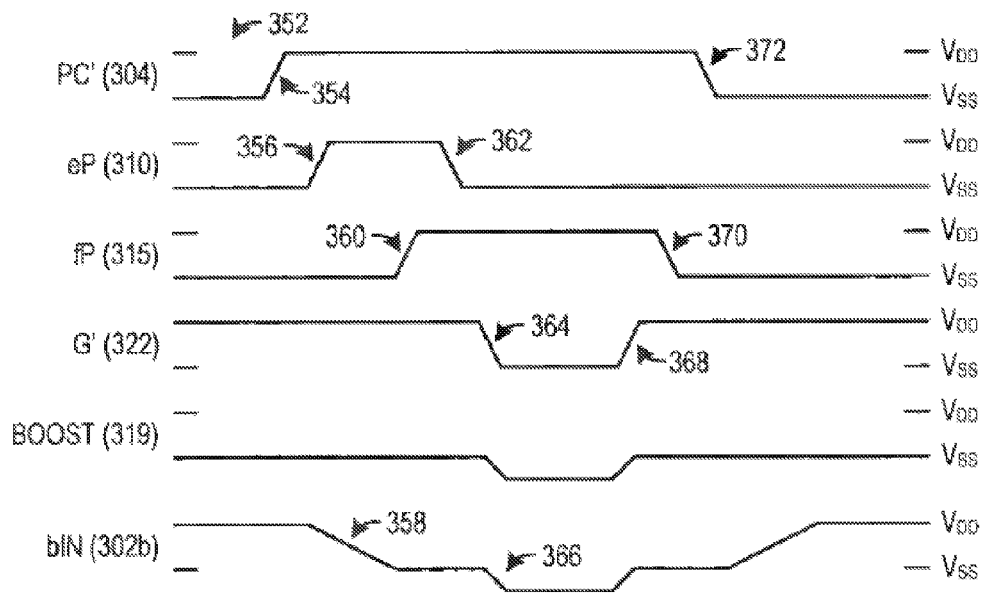
FIG. 3B shows example waveforms occurring during operation of the voltage boost circuitry of FIG. 3A, in accordance with one embodiment.

As illustrated at 358 of FIG. 3B, the voltage on bitline 302b begins to fall as the current being conducted though transistor 314 discharges the intrinsic capacitance of bitline 302b. At 360, active-high signal fP (315) applied to transistor 316 is asserted, thereby enabling transistor 316 to couple bitline 302b to bitline terminal 317 of bitline boost capacitor 318 at boost node 319. Bitline boost command terminal 320 of capacitor 318 is held at the positive supply voltage by signal G' (322), referred to herein as a "bitline boost command signal" or, more generally, a "boost command signal." The coupling of bitline terminal 317 of capacitor 318 to the negative supply via transistors 316 and 314 while active-low signal G' remains deasserted restores the charge across capacitor 318 to the full supply potential. At 362, active-high signal eP is deasserted, thus decoupling bitline 302b and bitline terminal 317 from the negative supply and allowing for bitline 302b to be boosted below negative supply voltage 303.

At 364, active-low boost command signal G' is asserted, thereby capacitively coupling charge from bitline boost capacitor 318 to the intrinsic bitline capacitance of bitline 302b at boost node 319 so as to boost bitline 302b below the negative supply at 366. This boosted voltage on bitline 302b provides the voltage assist that may be needed to ensure that the access transistors provide sufficient current to operate as desired.

Once the cell access operation has been performed, active-low boost command signal G' is deasserted at 368, which returns the bitline to the pre-boosted negative supply voltage. Next, signal fP is deasserted at 370 in order to disable transistor 316 and disconnect the boost capacitor. Finally, precharge signal PC' is asserted at 372 to return the bitline to the level of the positive supply.

Operation of voltage boost circuitry 300 when writing an opposite state would proceed as described above with the following differences: (i) the described behavior of signal fP is instead carried out by signal fN applied to transistor 326, and (ii) the behavior of signal eP is instead carried out by signal eN applied to transistor 312. Such operation will thus boost the voltage on bitline 302a below the negative supply voltage. Signals eN, eP, fN, and fP may be provided, for example, via column decoding logic (e.g., via column decoder 116), whereas signals PC' and G' may be common across all columns in some embodiments. It will be appreciated that, as with voltage boost circuitry 200 of FIG. 2A, at least some of the signals applied to voltage boost circuitry 300 may be dynamically level-shifted/translated in order to ensure proper operation during both "normal" and "boosted" conditions.

As mentioned above, a typical SRAM cell is supplied with five "signals," each of which may be adjusted in order to improve performance of the SRAM cell. In addition to boosting wordlines above a positive supply voltage and bitlines below a negative supply voltage, it may be desirable to boost the positive supply voltage (e.g., supply voltage 148) and/or the negative supply voltages (e.g., supply voltage 150) provided to the SRAM cells. For example, a positive supply voltage may be increased in order to improve read margin, or may be decreased to improve write margin. Similarly, a negative supply voltage may be increased to improve write margin, or may be decreased to improve read margin. The circuits of FIGS. 2A and 3A may also be used to increase and decrease supply voltages.

In addition to generally providing voltage boost, the present description includes providing a specific amount of voltage boost by controlling the size of the capacitance employed in the above-described capacitive coupling. Specifically, the amount of voltage boost induced depends upon the relative sizing of the boost capacitor (e.g., boost capacitors 216 and 318) to the intrinsic capacitance of the one or more coupled SRAM line(s). As boost capacitance increases in relation to the capacitance of the coupled SRAM line(s), so too does the amount of voltage boost that may be provided. Increasing the size of the boost capacitor enables it to store more charge, and to therefore produce a larger change in the voltage on the coupled SRAM line when the boost command signal is asserted to cause the capacitive charge coupling/sharing.

Quantitatively, the amount of voltage boost $V_B$ above or below the supply depends upon the capacitance of the boost capacitor ($C_B$), the intrinsic capacitance of the one or more coupled SRAM line(s) ($C_I$), and the voltage range between the positive supply voltage and the negative supply voltage ($V_{RANGE}$) as follows:

$$V_B = V_{RANGE}\left(\frac{C_B}{C_B + C_I}\right).$$

For example, if the capacitance of a particular boost capacitor is equal to the intrinsic capacitance of the coupled SRAM line(s), the amount of available voltage boost, ignoring non-idealities, is equal to half the supply voltage range.

In addition to selecting boost capacitance at design phases, the present description includes mechanisms for dynamically selecting boost capacitance during operation of the device. Various considerations can affect the selection of the boost capacitance to dynamically provide different boost levels. For example, as operating temperatures fluctuate during use, the amount of voltage assist provided may similarly fluctuate in order to ensure proper device operation. Different levels of boost may be employed to account for the power state of the SRAM array or of circuitry and logic that make use of the SRAM array. Boost needs may fluctuate with changing device operation modes (e.g., varying positive and/or negative supply voltages, varying clock frequencies, etc.). Different portions of the SRAM array may require different levels of boost based on testing that shows different behavior (e.g., one cell needing more boost than another).

Figure 4A:
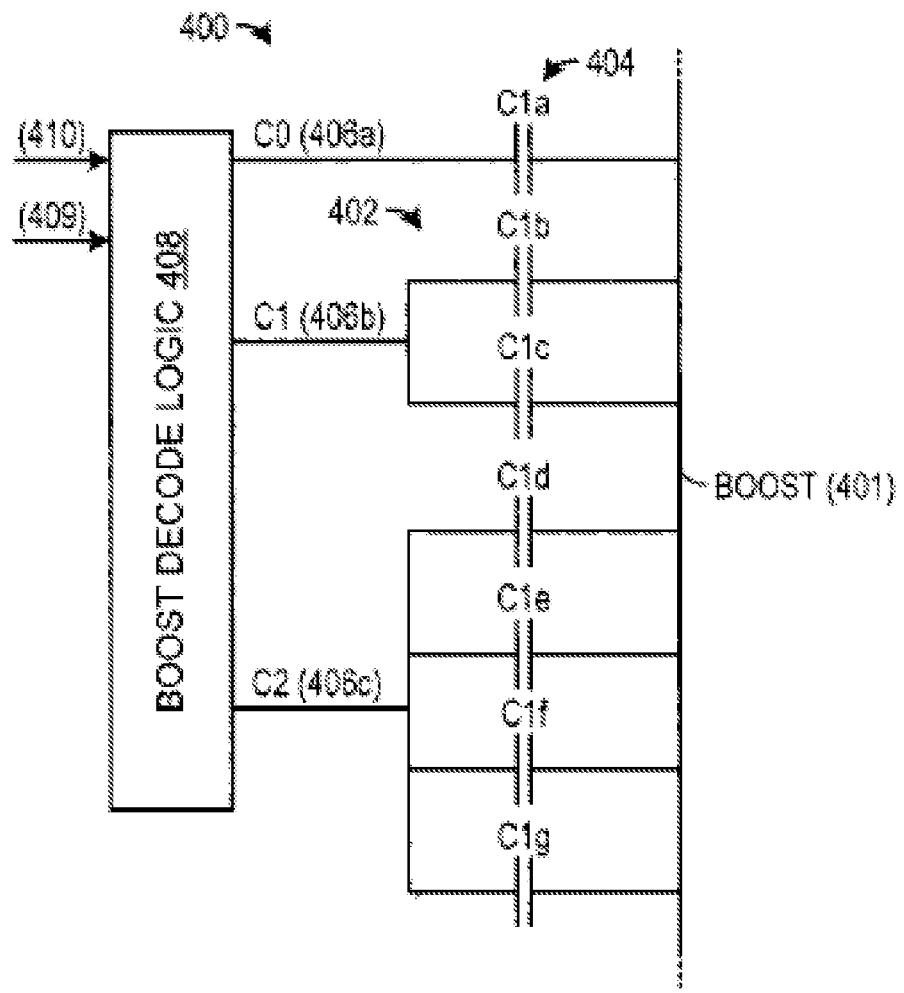
FIGS. 4A and 4B show example capacitor arrays for providing variable levels of voltage assist to SRAM lines, in accordance with one embodiment.

Turning now to FIG. 4A, the figure shows one non-limiting example of boost capacitor array 400 for providing variable amounts of boost capacitance to boost node 401 (e.g., boost node 219 and/or 319), and thus to any one or more coupled SRAM lines (e.g., via boost circuitry 224 and/or 319). Capacitor array 400 may be substituted, for example, for boost capacitor 216 of voltage boost circuitry 200 and/or for boost capacitor 318 of voltage boost circuitry 300 in some embodiments. Essentially, the array provides an implementation in which the boost capacitance coupled to the wordlines or bitlines and its enabling signal are segmented to allow control over how much capacitance is used during capacitive charge coupling. Although capacitor array 400 typically will be larger in size than capacitors 216 and 318, the ability to dynamically vary boost levels based on address and other conditions can provide significant advantages. Furthermore, capacitor array 400 may be used for multiple SRAM lines (i.e., wordlines and/or bitlines), allowing its size to be amortized across those SRAM lines.

As illustrated, capacitor array 400 may include a plurality of capacitor groups 402, each including one or more capacitors 404 coupled to a boost command signal 406 that is segmented (lines 406*a*, 406*b* and 406*c* constitute signal "segments" and carry signals C0, C1 and C2 that may be asserted individually or in any combination). Signals C0, C1 and C2 are thus a segmented equivalent to boost command signal C (FIG. 2A) and boost command signal G' (FIG. 3A). In some embodiments, each capacitor C1 a-C1 g is equal in value. Thus when the capacitors are grouped as indicated in powers of 2, asserting C0, C1 and C2 respectively provide 1, 2 and 4 "units" of capacitance.

Boost decode logic 408 may be provided to control the enabling of a selected amount of boost capacitance. In the example, signal 409 defines the amount of boost capacitance that will be employed and is 3 bits wide corresponding to the fact that array 400 has three groups of capacitors. Each bit controls whether signals C0-C1 are asserted; e.g., when signal 409 takes on a value of {111}, this corresponds to a boost command signal that couples charge from 7 "units" of capacitance onto the relevant wordline/bitline. Accordingly, signal 409 can be used to select anywhere from 0 to 7 units of capacitance. As indicated, boost decode logic 408 may also be responsive to a global enable signal 410, which dictates whether or not any amount of boost will be employed. As discussed below, the value of signal 409 can be controlled based on the particular cell(s) being accessed and a wide variety of other considerations.

Capacitor arrays may be implemented in a wide variety of configurations other than shown in the specific example. One variation is to use more (or fewer) groups of capacitors—e.g., a 6-bit signal could be used to select between 0 and 65 units of capacitance. A single capacitor array can be used for all wordlines (or bitlines), or multiple arrays can be used, each being used for a subset of the wordlines (or bitlines), as another example. The capacitor array can be controlled with a binary select signal, as shown in FIG. 4A, or it could use a thermometer-coded control signal.

Referring still to FIG. 4A, typically one or more capacitor groups 402 will be "disabled" (e.g., not contributing to voltage assist) at any given time. However, since the disabled capacitors remain coupled to boost node 401, they nonetheless increase loading and may potentially decrease performance of capacitor array 400 (e.g., due to increase charging time on boost node 401).

Figure 4B:
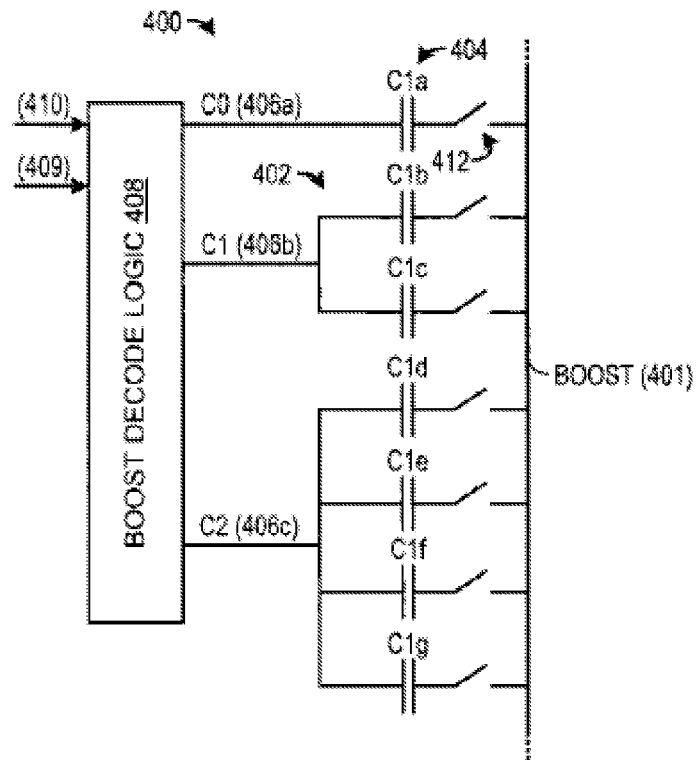

Accordingly, FIG. 4B illustrates an alternate implementation of capacitor array 400 of FIG. 4A, which includes a switching element 412 (e.g., FET transistor) coupled between each capacitor 404 and boost node 401. In other embodiments, a single switch 412 is coupled between each capacitor group 402 and boost node 401. Regardless of the specific configuration, the switches are operative to decouple selected capacitors 404 from the boost node in order to decrease capacitive loading. The decoupled capacitors are therefore not charged and discharged during the boost command cycle, which can potentially improve performance over that available with an unswitched array. Though not illustrated, the switching may be controlled by additional signals provide from boost decode logic 408.

Use of the capacitor arrays of FIGS. 4A and 4B allow voltage boost levels to vary dynamically during operation based on a wide range of factors. Boost level may be adjusted based on (1) the power state of the SRAM array or circuitry accessing the SRAM array; (2) temperature; (3) the particular operation being performed, e.g., reading versus writing; (4) measured supply voltage; and/or (5) the address of the cell being accessed. Regarding (5), any level of granularity may be employed, ranging from groups of rows and columns down to individual cells.

Address-based variations may be based on observed performance of the SRAM device, as obtained through testing or other methods. In some embodiments, the SRAM array may be configured to test operation of the SRAM cells (e.g., via Built-In Self Test "BIST" mechanisms, etc.) in order to determine an amount of voltage assist to provide. Testing may occur, for example, upon device startup, at various intervals, in response to particular operating conditions (e.g., operating temperature over a predefined threshold, change in supply voltage(s) and/or operating modes), etc. Test results may be stored in various ways (e.g., lookup tables, content-addressable memory "CAM," etc.) for future use in controlling boost levels.

Figure 5:
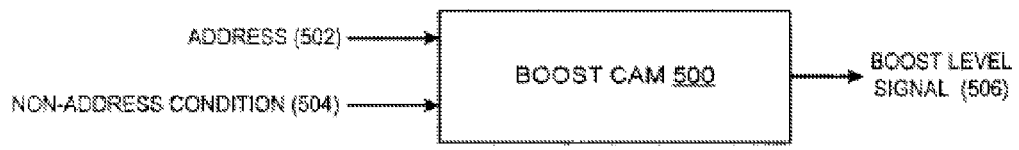
FIG. 5 schematically depicts a mechanism for providing a variable level of voltage boost based on address and other parameters/conditions, in accordance with one embodiment.

FIG. 5 depicts a schematic example of a mechanism for generating a specific boost level dynamically in response to an address and/or other conditions, in the form of boost CAM 500. An address signal 502 and a signal 504 specifying conditions/parameters other than address are provided to the CAM as inputs. Boost CAM 500 stores boost levels and provides a lookup that correlates specific input values and combinations thereof with a boost level, which is output as a signal 506 that encodes the specific level of boost to be employed. Referring to FIGS. 4A and 4B, boost level signal 506 may be applied as the input 409 to the boost decode logic 408 in order to select a level of boost capacitance. In one implementation, boost CAM 500 outputs a default level of boost via signal 506 unless there is a match with an entry in the boost CAM, in which case a specified non-default level of boost is output via signal 506.

Address correlations in boost CAM 500 can be at any level of granularity. Boost levels may be specified for individual rows and columns, or for groups of rows and columns. In the most general case, particular boost levels can be specified for individual cells. Similar flexibility and specificity may be employed with the other conditions (power state, temperature, supply voltage, read versus write, etc.). Entries in the CAM may be populated at the design phase or during operation (e.g., via testing). The CAM may be arranged so that a more specific match overrides a less specific match. For example, one CAM entry may specify the boost to be applied to a group of four rows while a second entry specifies the boost to be applied to one row of the four. With these two entries, three of the rows will receive the boost assigned to the four-row group while the remaining row receives its individual boost.

Aspects of this disclosure have been described by example and with reference to the illustrated embodiments listed above. Components that may be substantially the same in one or more embodiments are identified coordinately and are described with minimal repetition. It will be noted, however, that elements identified coordinately may also differ to some degree. The claims appended to this description uniquely define the subject matter claimed herein. The claims are not limited to the example structures or numerical ranges set forth below, nor to implementations that address the herein-identified problems or disadvantages of the current state of the art.

Address-Based SRAM Access Assists

As previously explained, various types of access assists (i.e., voltage boosting) may be employed to improve read and write reliability of SRAM storage cells (i.e., bits) without relying on changing transistor sizes. Examples of the different types of voltage boosting include bitline voltage boosting, wordline voltage boosting, and supply voltage ($V_{DD}$) boosting. In one embodiment, the bitline voltage boosting and supply voltage boosting may be enabled during write operations and disabled during read operations to avoid unwanted side-effects during read operations. In one embodiment, wordline voltage boosting may be used during read operations or during write operations.

In one embodiment, the bitline that encodes the low differential value of the data (i.e., the negative bitline) is boosted by lowering the voltage of the negative bitline below the low voltage supply level (e.g., $V_{SS}$) provided to the storage cell, which is typically ground, to perform access assist. In one embodiment, the bitline that encodes the high differential value of the data (i.e., the positive bitline) is boosted by increasing the voltage of the positive bitline above the high voltage supply level (e.g., $V_{DD}$) provided to the storage cell to perform access assist. In one embodiment, $V_{DD}$ voltage boosting (i.e., $V_{DD}$ collapse) reduces a column supply voltage from the high supply voltage ($V_{DD}$) to a collapsed voltage level that is lower than the high supply voltage to perform access assist. In one embodiment, wordline voltage boosting for a read operation reduces (i.e., under-drives) a voltage level of the wordline corresponding to the storage cells to be accessed for the read operation to perform access assist. Conversely, wordline voltage boosting for a write operation increases (i.e., over-drives) a voltage level of the wordline corresponding to the storage cells to be accessed for the write operation to perform access assist.

Figure 6:
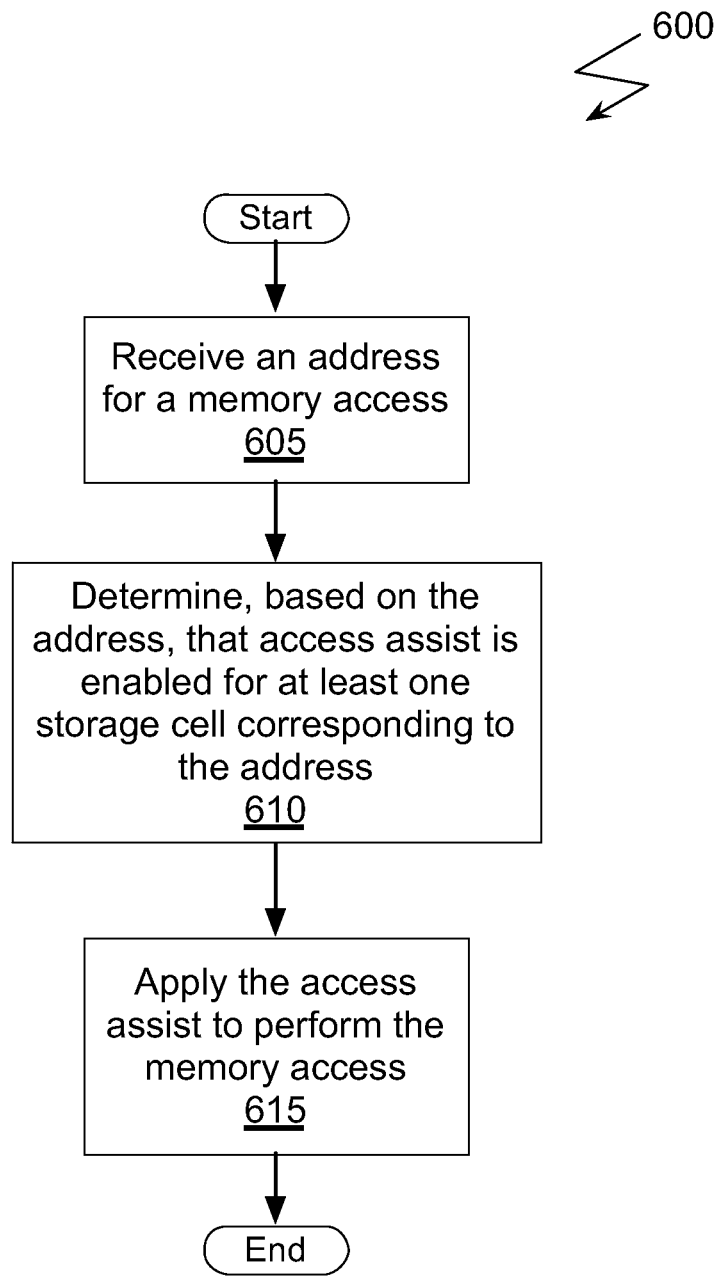
FIG. 6 illustrates a flowchart of a method for performing address-based memory access assist, in accordance with one embodiment.

FIG. 6 illustrates a flowchart of a method 600 for performing address-based memory access assist, in accordance with one embodiment. At step 605, an address for a memory access is received. In the context of the following description, a memory access operation may be a read operation or a write operation. The address corresponds to at least one storage cell in a memory array of storage cells to be accessed. At step 610, a determination is made, based on the address, that access assist is enabled for the at least one storage cell corresponding to the address. At step 615, the access assist is applied to the at least one storage cell to perform the memory access. In addition to the address, the access assist may also be enabled or disabled based on a non-address condition including one or more of (1) the power state of the SRAM array or circuitry configured to access the RAM array, (2) operating conditions (e.g., measured temperature, measured supply voltage, operating frequency, or scaled supply voltage), and (3) the type of the particular operation being performed (e.g., read or write). In some embodiment, the supply voltage level may be scaled to one or more predetermined voltage levels to reduce power consumption or increased to improve processing performance.

As previously explained, any level of granularity may be employed when enabling or disabling access assist based on the address. For example, the access assist may be enabled for individual storage cells specified by the address, by one or more rows of storage cells, by one or more columns of storage cells, or for any other grouping of the storage cells that corresponds to at least a portion of the address.

More illustrative information will now be set forth regarding various optional architectures and features with which the foregoing technique may or may not be implemented, per the desires of the user. It should be strongly noted that the following information is set forth for illustrative purposes and should not be construed as limiting in any manner. Any of the following features may be optionally incorporated with or without the exclusion of other features described.

Figure 7A:
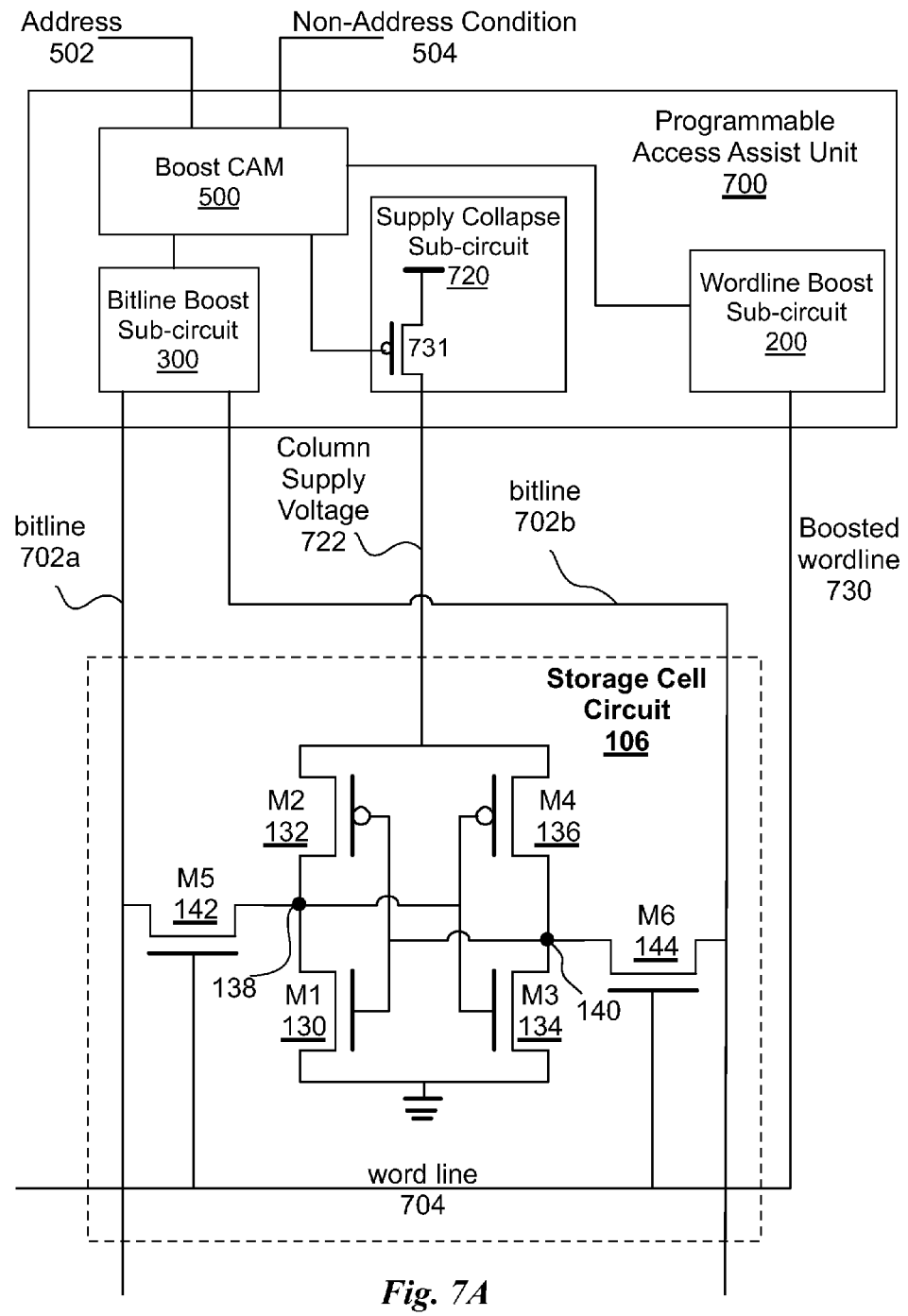
FIG. 7A illustrates the storage cell circuit of FIG. 1B, coupled to a programmable access assist unit 700, in accordance with one embodiment

FIG. 7A illustrates the storage cell circuit 106 of FIG. 1B, coupled to a programmable access assist unit. 700, in accordance with one embodiment. The programmable access assist unit 700 includes the bitline boost sub-circuit 300 of FIG. 3A, the wordline boost sub-circuit 200 of FIG. 2A, the boost CAM 500 of FIG. 5, and a supply collapse sub-circuit 720. The boost CAM 500 receives the address and non-address condition 504 for a memory access and generates one or more access assist control signals that are output to the bitline boost sub-circuit 300, the wordline boost sub-circuit 200, and a supply collapse sub-circuit 720 to selectively apply the various types of access assist that are performed by the bitline boost sub-circuit. 300, the wordline boost sub-circuit 200, and a supply collapse sub-circuit 720. Each type of access assist and combination of different types of access assist is a variation of access assist that may be provided by the programmable access assist unit 700.

As shown in FIG. 7A, rather than coupling the sources of the transistors 132 and 136 directly to $V_{DD}$, the sources of the transistors 132 and 136 are instead coupled to $V_{DD}$) through a pull-up transistor 731 within a supply collapse sub-circuit 720. In one embodiment, access assist for a write operation is achieved by a combination of boosting the negative bitline 7020 and collapsing the column supply voltage 722 for the storage cell that is written. The programmable access assist unit 700 may be configured to collapse the column supply voltage 722 that is provided to the storage cell circuit 106 during a write operation by reducing the column supply voltage 722 from the high supply voltage ($V_{DD}$) to a collapsed voltage level that is lower than the high supply voltage. Collapsing the column supply voltage 722 reduces the voltage level provided to the pullup transistors 132 and 136 of the storage cell circuit 106.

Boosting the negative bitline 702a increases the gate source voltage (Vgs) of the pass transistor 142 and node 138 is pulled lower compared with providing the (non-boosted) low supply voltage at bitline 7020. The source gate voltage (Vsg) on the pullup transistor 136 is increased, thereby strengthening the pullup transistor 136 and the pass transistor 142. The voltage collapse reduces the column supply voltage 722 and decreases the Vsg on the pullup transistor 132, thereby weakening the pullup transistor 132. Note that using high supply voltage collapse alone will also decrease the strength of the pullup transistor 136 (which is not desired) and pulling node 140 high will be more difficult. However, combining the negative bitline boost with the high supply voltage collapse counteracts the decrease in strength of the pullup transistor 136.

In another example, the bitline 702b is at the low voltage level $V_{SS}$, the bitline 702a is at the high voltage level=$V_{DD}$, and the storage ca circuit 106 holds the opposite value where node 138 is at the low voltage level and node 140 is at the high voltage level. The programmable access assist unit 700 is configured to boost the negative bitline 702b and collapse the column supply voltage 722 during a write operation. Boosting bitline 702b increases the Vgs of the pass transistor 144, which will pull node 140 lower compared with providing the (non-boosted) low supply voltage (e.g., $V_{SS}$) at the negative bitline 702b. The Vsg on the pullup transistor 132 is increased, thereby strengthening the pullup transistor 132 and the pass transistor 144. The voltage collapse reduces the column supply voltage 722 and decreases the Vsg on the pullup transistor 136, thereby weakening the pullup transistor 136. Note that using high supply voltage collapse alone will also decrease the strength of the pullup transistor 132 (which is not desired) and pulling node 138 high will be more difficult. However, combining the negative bitline boost with the high supply voltage collapse counteracts the decrease in strength of the pullup transistor 132.

When the voltage collapse is enabled for the storage cell circuit 106, the (p-type metal-oxide-semiconductor) PMOS transistor 731 is disabled by the boost CAM 500, so the column supply voltage 722 floats. Note that because the column supply voltage 722 was previously pulled up to the high supply voltage, the floating column supply voltage 722 is at a high voltage level. When the voltage collapse is not enabled, the column supply voltage 722 is pulled up to the high supply voltage by the PMOS transistor 731. To complete a write operation, the pullup 136 within the storage cell circuit 106 must pull the low internal node 140 high (assuming that boosted bitline 702b is high and boosted bitline 702a is low). So that the pullup transistor 136 can pull the 140 node high, the column supply voltage 722 should be restored to the high supply voltage level before the word line 704 is negated (i.e., turned off). To keep the pullup transistor 136 strong, the negative bitline 702a should still be boosted as the high supply voltage, e.g., $V_{DD}$, is restored to the column supply voltage 722.

Although only a single storage cell circuit 106 is shown in FIG. 7A, multiple storage cell circuits 106 may be configured in an array having two or more rows. Each row is separately enabled, according to an address and the word line 704 is asserted to perform read and write operations. Storage cell circuits 106 in an array may be organized in one or more columns where a portion of the address is used to select between the different columns for read and write operations. The column supply 722 is the column supply voltage that is provided by the column supply collapse sub-circuit 720 to storage cell circuits 106 in a column of the SRAM array. The bitline boost sub-circuit 300 can be shared between two or more columns of an SRAM array. The programmable access assist unit 700 may also be used with no column interleaving or may be shared between more than two columns of the SRAM array. In one embodiment, each variation of access assist may be applied to individual storage cells or to a subset of storage cells to perform a memory access.

The programmable access assist unit 700 may increase the number of gates and/or delay for a timing critical path during memory accesses because the boost CAM 500 is read for each memory access to generate the access assist control signals. In one embodiment, the programmable access assist unit 700 is pipelined to match the latency of the address decode for the SRAM. In another embodiment, the read of the boost CAM 500 occurs during a precharge phase of a memory access operation and the application of the access assist is applied during a phase when the wordline and/or bitline is coupled to storage cells to read or write the storage cells corresponding to the address. In one embodiment, the boost CAM 500 is not read for each memory access and a speculative or learning scheme is used to determine whether or not to apply access assist for a particular access. For example, if the last address that was accessed in the address is immediately before or after the current address, the same access assist that was specified for the last address is applied to the storage cells corresponding to the current address.

The boost CAM 500 may be configured to store one or more access assist maps to generate access assist signals based on the address 502 and/or non-address condition 504. An access assist map indicates addresses of a memory array that correspond to storage cells for which an access assist variation is enabled (i.e., any combination of one or more of bitline voltage boosting, wordline voltage boosting, and supply voltage collapse). The particular access assist variation for the one or more storage cells corresponding to an address may be specified by a bitmask.

For any particular type of access assist, the access assist map may also specify a level of access assist. For example, differing levels or strengths of voltage boost may be specified for different storage cells. The particular level for an access assist variation for the one or more storage cells corresponding to an address may also be specified by the bitmask. Different access assist maps or portions of an access assist map may be used for different non-address conditions, such as access operations. For example, a first access assist map may be used for read operations and a second access assist map may be used for write operations.

Some of the storage cells corresponding to an address may require no access assist while one more may require different variations of access assist that are specified by the access assist map. When none of the storage cells corresponding to an address require access assist, the address is not stored in an access assist map. Therefore, the number of entries in an access assist map may increase as the number of storage cells that require access assist increases. If the access assist is applied only for the individual storage cells that require access assist, then energy consumption can be reduced compared with applying access assist for all of the storage cells in an array.

However, energy consumption can be reduced by applying access assist to a subset of the storage cells in the array that correspond to a portion of an address or a range of addresses, even if all of the storage cells in the subset do not require access assist. Examples of subsets include, but are not limited to, the storage cells in a row of a memory array and a sub-block of N×M storage cells, where N and M are integers greater or equal to one. In one embodiment, an access assist variation may be specified for each storage cell in the subset. A benefit of applying access assist to a subset of storage cells corresponding to an address is that the number of entries of the access assist map(s) within the boost CAM 500 may be reduced because the granularity of the address is reduced. Using storage cell subsets allows arbitrary sized regions of the memory array to be addressed with a single entry of an access assist map. This can be useful for addressing failing storage cells that are spatially correlated in the physical layout of the memory array.

Alternatively, the access assist map may only specific a "worst-case" access assist for a subset of storage cells corresponding to an address. In one embodiment, the worst-case access assist is a combination of the different variations of access assist for all of the storage cells in the subset for which access assist is enabled. A benefit of applying access assist to a subset of storage cells is that the size of the access assist map(s) within the boost CAM 500 is reduced because the granularity of the address is reduced and a single variation of access assist is specified for multiple storage cells rather than specifying a variation of access assist for each individual storage cell that corresponds to the address. Furthermore, the granularity of the address may be changed dynamically so that the number of storage cells in the subset can be reduced or increased, thereby increasing or reducing, respectively, the energy consumed to perform access assist.

When a non-address condition 504 is provided along with the address 502, the access assist variation that is specified by the access assist map may be modified based on the non-address condition 504. In particular, the boost CAM 500 or programmable access assist unit 700 may be configured to increase or decrease a level of voltage boost based on a non-address condition 504. Alternatively, a different access assist map may be generated for each non-address condition 504. In one embodiment, the boost CAM 500 may be implemented with a ternary content addressable memory (TCAM) structure. The access assist map is generated by characterizing the function of each storage cell or subset in the memory array using different variations of access assist. In one embodiment, the assist map is generated by characterizing the function of each addressable location in the memory array using different variations of access assist and different non-address conditions 504.

Figure 7B:
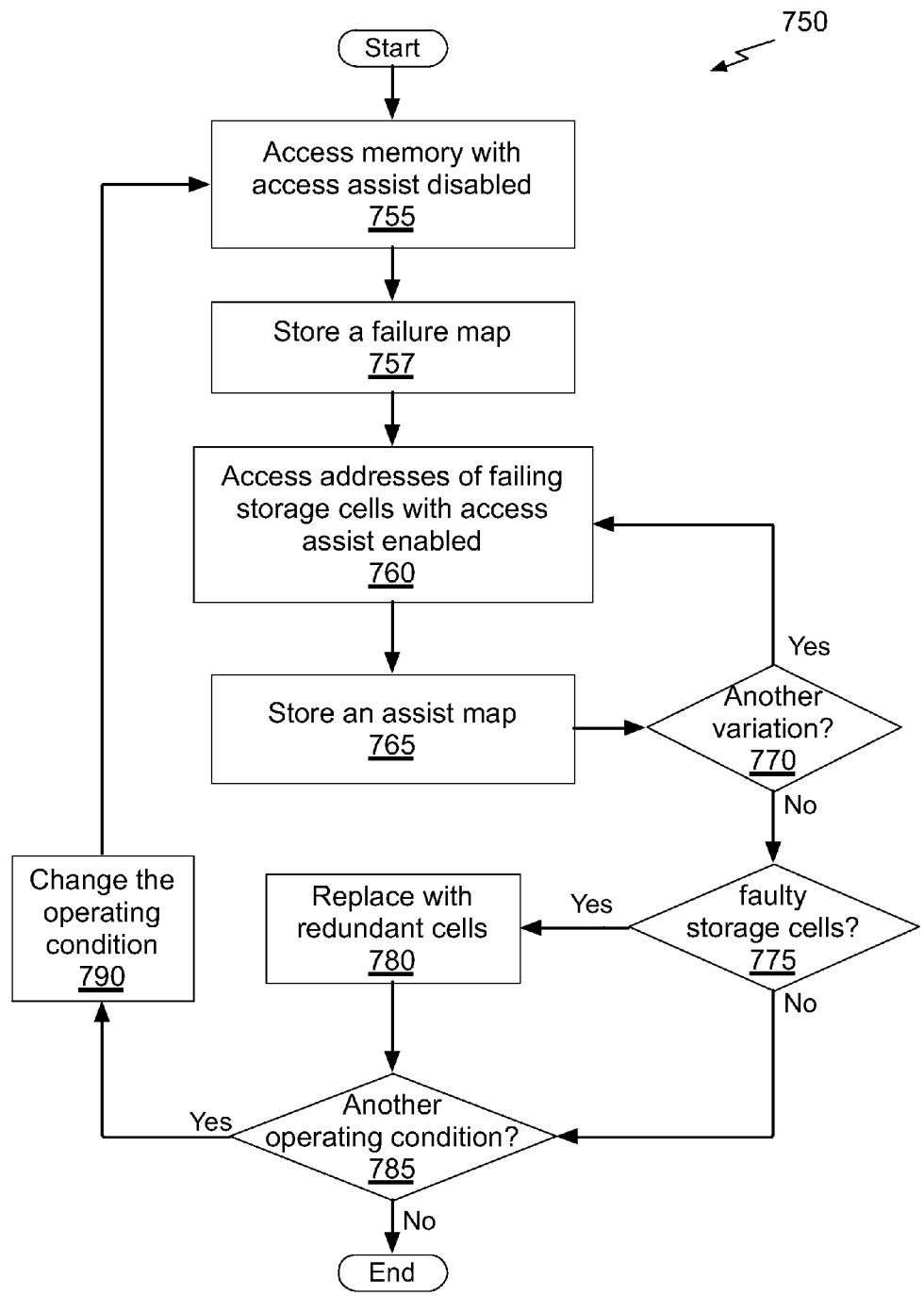
FIG. 7B illustrates a flowchart of a method for generating one or more assist maps that are used to perform address-based memory access assist, in accordance with one embodiment.

FIG. 7B illustrates a flowchart of a method 750 for generating one or more assist maps that are used to perform address-based memory access assist, in accordance with one embodiment. Although the method 750 is described in the context of a program executed by a processor, the method 750 may also be performed by custom circuitry or by a combination of custom circuitry and a program. At step 755, each address of a memory array is accessed with access assist disabled, so that no access assist is applied during the read and/or write operations. At step 757, a failure map is generated that specifies the failing storage cells. The failure map is stored in an access assist map or in another memory. Addresses corresponding to storage cells that do not fail for reads and writes do not require any variation of access assist and need not be stored in the failure map or in an access assist map.

At step 760, the addresses of failing storage cells (according to the failure map) are accessed with a variation of access assist enabled to generate an access assist map for the variation of access assist. The addresses that passed with access assist disabled are not accessed during step 760. The variation of access assist that is enabled may be any combination of access assist that is supported by the programmable access assist unit 700. At step 765, the passing storage cells are identified and an indication of the passing storage cells is stored to generate an access assist map for the variation of access assist that was applied at step 760. At step 770, it is determined whether another variation of access assist is supported by the programmable access assist unit 700. If another variation of access assist is supported, then the failing addresses corresponding to the failure map stored at step 757 should be characterized for the other variations of access assist by returning to step 760.

Otherwise, at step 775, it is determined if any of the failing storage cells do not pass for at least one variation of the access assist. In other words, there is no variation of the access assist for which the storage cell can be reliably accessed (i.e., passes) and the storage cell is considered faulty. If at least one faulty storage cell exists, then at step 780, the faulty storage cells are replaced with redundant storage cells before proceeding to step 785. The redundant storage cells should be accessed during steps 755 and 760 to characterize the redundant cells. If possible, the redundant cells that are used to replace the faulty storage cells should function without access assist. However, replacement redundant cells that do require some variation of access assist may be used to replace faulty storage cells. The access assist maps should be updated accordingly when replacement occurs.

If, at step 775, there are no faulty storage cells, the at step 785, it is determined if another operating condition exists.

When another operating condition exists (e.g., different operating voltage, temperature, etc.) the storage cell accesses may be characterized for each of the different operating conditions across all of the different access assist variations to generate additional access assist maps. An access assist map may be generated for different ranges of a particular operating condition. For example, two or more discrete voltage levels can be selected in the operating voltage range of the memory array at startup and separate access assist maps can be generated for each range. As the operating voltage is scaled down, an on-chip monitoring circuit can measure the operating voltage and select the access assist map to be used for accessing the memory. Rather than storing multiple access assist maps, two access assist maps may be generated, one for the high end of the measured voltage range and one for the low end of the measured voltage range. Similarly, separate access assist maps for different measured temperature values or ranges can also be generated.

Rather than generating an access assist map for each operating condition or operating condition range, the access assist variations specified in one or more access assist maps may be modified (e.g., increased or decreased by a predetermined amount based on the operating condition) for one or more of the different operating conditions. As shown in FIG. 7B, if a different operating condition exists at step 785, then at step 790, the operating condition is changed, and the process is repeated starting at step 755.

The structure that is implemented to store the one or more access assist maps may be volatile, so that the access assist map is regenerated after every power down of the SRAM or portion of the SRAM including the boost CAM 500. In one embodiment, a count of use cycles during which each access assist map is read may be maintained and when the count is greater than a predetermined value for an access assist map, the access assist map may be regenerated using the method 750 shown in FIG. 7B. In another embodiment, the structure that is implemented to store the one or more access assist maps is non-volatile, and the access assist maps may be regenerated after an amount of time has transpired because the SRAM behavior may change over time, i.e., as the SRAM ages. The non-address condition 504 may also include an aging factor that corresponds to one or more time durations, so that the particular access assist that is applied may be tuned based on aging of the SRAM.

Figure 8A:
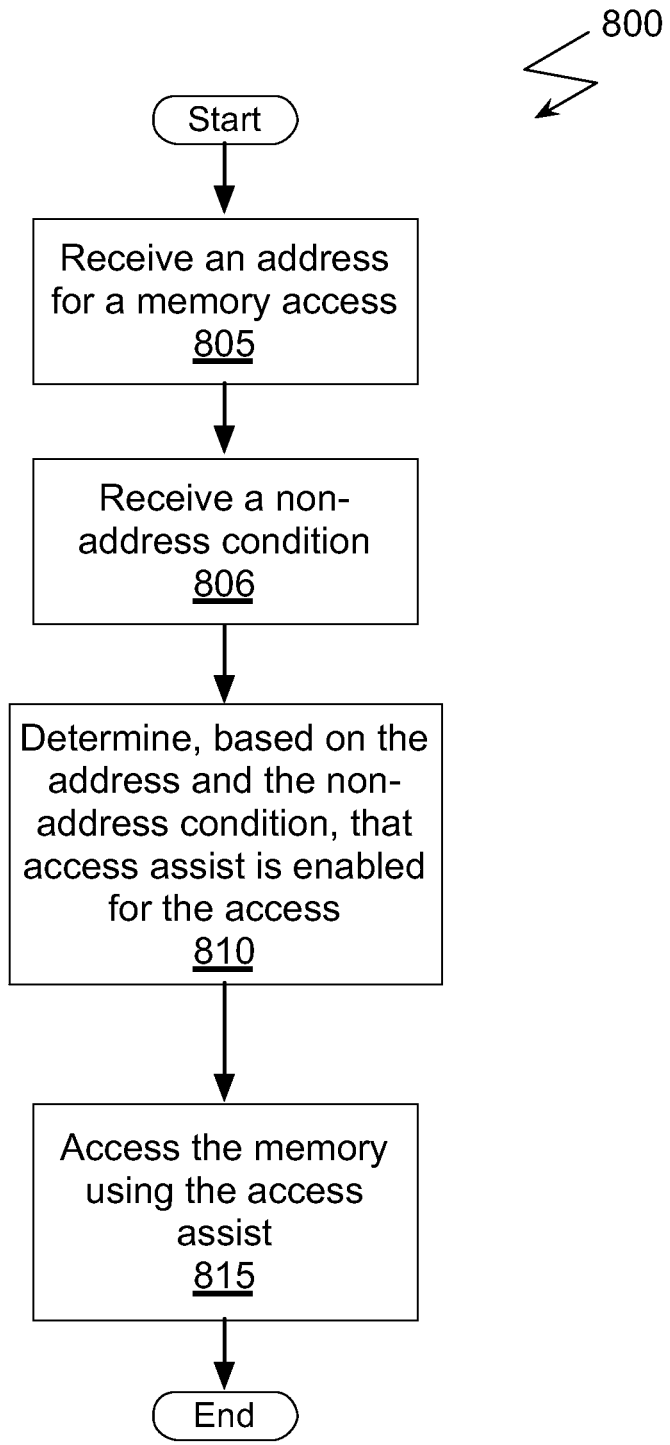
FIG. 8A illustrates another flowchart of a method for performing address-based memory access assist, in accordance with one embodiment.

FIG. 8A illustrates another flowchart of a method 800 for performing address-based memory access assist, in accordance with one embodiment. Although the method 800 is described in the context of a program executed by a processor, the method 800 may also be performed by custom circuitry or by a combination of custom circuitry and a program. At step 805, the programmable access assist unit 700 receives an address for a memory access. At step 806, the programmable access assist unit 700 receives a non-address condition associated with the address. At step 810, the programmable access assist unit 700 determines whether access assist is enabled for the memory access based on the address and the non-address condition.

At step 815, the programmable access assist unit 700 generates the access assist control signals that are applied to the memory array to perform the access. The access assist control signals may be configured to disable access assist for one or more storage cells and/or to apply a variation of access assist for one or more storage cells for which access assist is enabled.

The programmable access assist unit 700 may be configured to allocate memory within the memory array for use as a cache or register file. When the amount of memory requested for an allocation is less than the total capacity of the memory array, the programmable access assist unit 700 may allocate a portion of the memory array to satisfy the allocation based on one or more access assist maps. The allocation may change dynamically based on a workload, and the programmable access assist unit 700 may change the allocation of the memory array to increase or decrease the allocation based on one or more access assist maps. In particular, the programmable access assist unit 700 may allocate the portion of the memory by minimizing the number of storage cells for which access assist is enabled to reduce the energy consumption for the allocation.

Furthermore, when a memory allocation is reduced, the subset of storage cells corresponding to each address of an access assist map may be decreased in size, to provide more specific access assist control for the allocated memory. For example, assuming that each subset of storage cells includes 8 storage cells and an access assist variation is specified for each subset, if the size of the allocation is decreased by $\frac{1}{8}^{th}$, an access assist variation may be specified for each individual storage cell instead of for each subset of 8 storage cells.

Figure 8B:
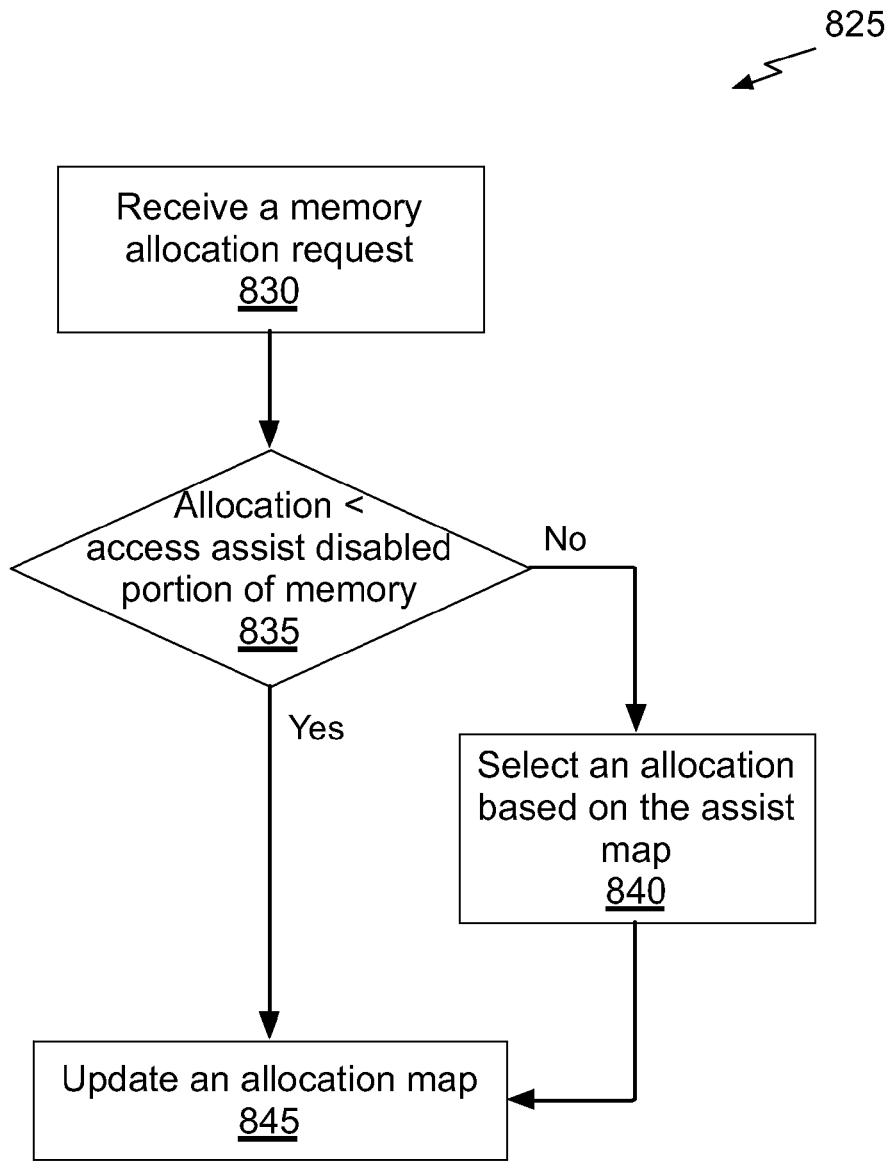
FIG. 8B illustrates a flowchart of a method for allocating memory using an assist map, in accordance with one embodiment.

FIG. 8B illustrates a flowchart of a method 825 for allocating memory using an assist map, in accordance with one embodiment. At step 830, the programmable access assist unit 700 receives a memory allocation request. At step 835, the programmable access assist unit 700 determines if the size of the allocation can be accommodated using storage cells for which access assist is disabled. If so, at step 845, the programmable access assist unit 700 updates an allocation map to specify a group of storage cells that do not require access assist to satisfy the allocation request.

Otherwise, at step 840, the programmable access assist unit 700 selects an allocation of storage cells based on one or more access assist maps that have been generated for the memory array. The allocation is selected to minimize the access assist needed for the allocated memory. At step 845, the programmable access assist unit 700 then updates the allocation map to specify the selected storage cells to satisfy the allocation request.

Using an address-based access assist or a combination of an address and non-address based access assist can reduce the energy consumed to read and write specific locations in a memory compared with using access assist to read and/or write all of the locations in the memory. The access assist map that is generated may also be used during memory allocation to reduce the energy that is consumed by selecting storage cells that do not require access assist or that minimize the access assist that is required.

Figure 9:
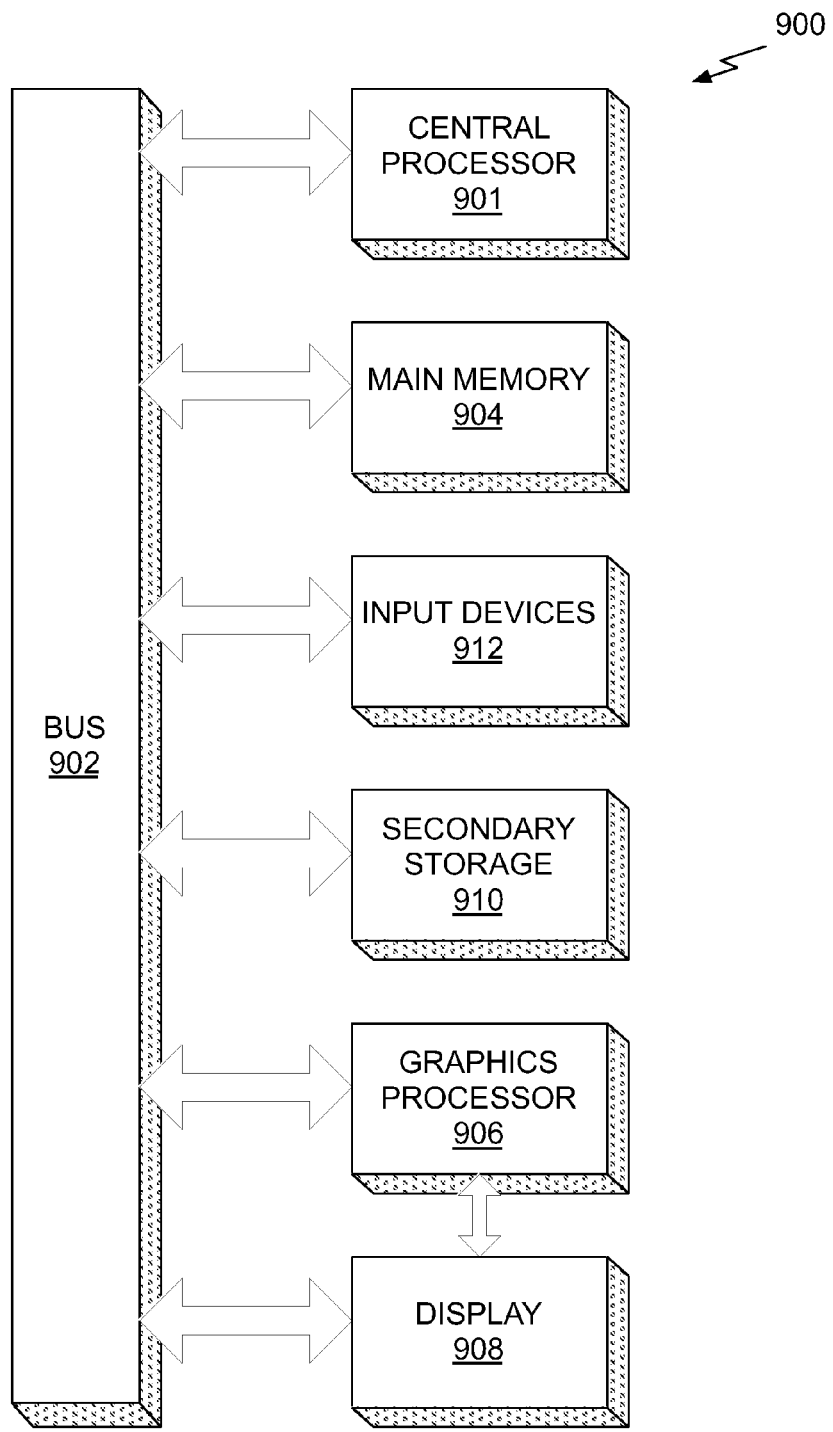
FIG. 9 illustrates an exemplary system in which the various architecture and/or functionality of the various previous embodiments may be implemented.

FIG. 9 illustrates an exemplary system 900 in which the various architecture and/or functionality of the various previous embodiments may be implemented. In particular, the address-based assist technique implemented by the programmable memory access assist unit 700 may be employed for one or more of the memory or register elements that rely on SRAM storage circuitry. As shown, a system 900 is provided including at least one central processor 901 that is connected to a communication bus 902. The communication bus 902 may be implemented using any suitable protocol, such as PCI (Peripheral Component Interconnect), PCI-Express, AGP (Accelerated Graphics Port), HyperTransport, or any other bus or point-to-point communication protocol(s). The system 900 also includes a main memory 904. Control logic (software) and data are stored in the main memory 904 which may take the form of random access memory (RAM).

The system 900 also includes input devices 912, a graphics processor 906, and a display 908, i.e. a conventional CRT (cathode ray tube), LCD (liquid crystal display), LED (light emitting diode), plasma display or the like. User input may be received from the input devices 912, e.g., keyboard, mouse, touchpad, microphone, and the like. In one embodiment, the graphics processor 906 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 900 may also include a secondary storage 910. The secondary storage 910 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 904 and/or the secondary storage 910. Such computer programs, when executed, enable the system 900 to perform various functions. The memory 904, the secondary storage 910, and/or any other storage are possible examples of computer-readable media.

In one embodiment, the architecture and/or functionality of the various previous figures may be implemented in the context of the central processor 901, the graphics processor 906, an integrated circuit (not shown) that is capable of at least a portion of the capabilities of both the central processor 901 and the graphics processor 906, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 900 may take the form of a desktop computer, laptop computer, server, workstation, game consoles, embedded system, and/or any other type of logic. Still yet, the system 900 may take the form of various other devices including, but not limited to a personal digital assistant (PDA) device, a mobile phone device, a television, etc.

Further, while not shown, the system 900 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
generating an access assist map that specifies at least one storage cell of a memory array for which access assist is enabled, where generating the access assist map comprises:
accessing the memory array with the access assist disabled;
identifying failing storage cells of the memory array;
accessing the failing storage cells of the memory array with the access assist enabled; and
indicating, in the access assist map, the failing storage cells that pass with the access assist enabled;
receiving an address for a memory access;
determining, based on the address, that the access assist is enabled for the at least one storage cell of the memory array corresponding to the address; and
applying the access assist to the at least one storage cell to perform the memory access.

2. The method of claim 1, wherein the access assist comprises at least one of bitline voltage boosting, wordline voltage boosting, and supply voltage boosting.

3. The method of claim 2, wherein the access assist specifies a level of voltage boosting.

4. The method of claim 1, where applying the access assist comprises:
applying a first access assist variation to a first storage cell of the at least one storage cell; and
simultaneously applying a second access assist variation to a second storage cell of the at least one storage cell.

5. The method of claim 1, further comprising receiving a non-address condition and determining that the access assist is enabled is based on the non-address condition.

6. The method of claim 5, wherein the non-address condition comprises one or more of a measured temperature, a measured supply voltage, an operating frequency, aging factor, and a scaled supply voltage.

7. The method of claim 5, wherein the non-address condition comprises one or more of a read operation or a write operation.

8. The method of claim 5, further comprising modifying the access assist based on the non-address condition.

9. The method of claim 1, wherein the access assist map specifies a variation of the access assist to be applied to the at least one storage cell.

10. The method of claim 1, wherein the access assist map specifies a first variation of the access assist for a first storage cell corresponding to the address and specifies a second variation of the access assist for a second storage cell corresponding to the address.

11. The method of claim 1, further comprising allocating a portion of the memory array based on the access assist map.

12. The method of claim 1, wherein the
access assist map specifies a first storage cell for which the access assist is enabled for a first operating condition and, further comprising
generating a second access assist map that specifies a second storage cell for which the access assist is enabled for a second operating condition.

13. A method comprising:
generating a first access assist map that specifies a first storage cell of a memory array for which a first variation of access assist is enabled for an operating condition;
generating a second assist map that specifies the first storage cell for which a second variation of the access assist is enabled for the operating condition;
receiving an address for a memory access, wherein the address corresponds to the first storage cell;
determining, based on the address, that the access assist is enabled for the first storage cell; and
applying the access assist to the first storage cell to perform the memory access.

14. The method of claim 1, further comprising replacing a faulty storage cell with a redundant storage cell.

15. An integrated circuit comprising:
a memory array of storage cells; and
an access assist circuit that is coupled to the memory array of storage cells and configured to:
generate an access assist map that specifies at least one storage cell of the memory array for which access assist is enabled, where generating the access assist map comprises:
accessing the memory cell array with the access assist disabled;
identifying failing storage cells of the memory array;
accessing the failing storage cells of the memory array with the access assist enabled; and
indicating, in the access assist map, the failing storage cells that pass with the access assist enabled;
receive an address for a memory access;
determine, based on the address, that access assist is enabled for at least one storage cell of the memory array corresponding to the address; and
apply the access assist to the at least one storage cell to perform the memory access.

16. The integrated circuit of claim 15, wherein the access assist comprises at least one of bitline voltage boosting, wordline voltage boosting, and supply voltage boosting.

17. The integrated circuit of claim 16, wherein the access assist specifies a level of voltage boosting.

18. The integrated circuit of claim 15, wherein the access assist circuit is further configured to receive a non-address condition and determine that the access assist is enabled is based on the non-address condition.

19. The integrated circuit of claim 15, wherein the access assist map specifies a variation of the access assist to be applied to the at least one storage cell.

20. The integrated circuit of claim 15, wherein the access assist map specifies a first variation of the access assist for a first storage cell corresponding to the address and specifies a second variation of the access assist for a second storage cell corresponding to the address.

* * * * *